(12) United States Patent
Gamble et al.

(10) Patent No.: US 10,886,893 B2
(45) Date of Patent: Jan. 5, 2021

(54) REDUCED-SIZE GUIDED-SURFACE ACOUSTIC WAVE (SAW) DEVICES

(71) Applicant: Qorvo US, Inc., Greensboro, NC (US)

(72) Inventors: Kevin J. Gamble, Winter Garden, FL (US); Alan S. Chen, Windermere, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/281,629

(22) Filed: Feb. 21, 2019

(65) Prior Publication Data

US 2020/0274519 A1 Aug. 27, 2020

(51) Int. Cl.
    *H03G 9/02* (2006.01)
    *H03H 9/02* (2006.01)
    *H03H 9/05* (2006.01)
    *H03H 3/08* (2006.01)
    *H03H 9/64* (2006.01)
    *H03H 9/145* (2006.01)
    *H03H 9/25* (2006.01)

(52) U.S. Cl.
    CPC .......... *H03H 9/02992* (2013.01); *H03H 3/08* (2013.01); *H03H 9/02559* (2013.01); *H03H 9/02637* (2013.01); *H03H 9/02866* (2013.01); *H03H 9/059* (2013.01); *H03H 9/0542* (2013.01); *H03H 9/14582* (2013.01); *H03H 9/25* (2013.01); *H03H 9/6483* (2013.01); *H03H 9/6489* (2013.01)

(58) Field of Classification Search
    CPC .... H03H 9/0542; H03H 3/08; H03H 9/02559; H03H 9/02637; H03H 9/02866; H03H 9/02992; H03H 9/059; H03H 9/14582; H03H 9/25; H03H 9/6483; H03H 9/6489
    USPC .......................................................... 333/194
    See application file for complete search history.

(56) References Cited

U.S. PATENT DOCUMENTS

| 9,654,084 B2 * | 5/2017 | You ........................ H03H 3/08 |
| 2017/0033756 A1 * | 2/2017 | Inoue ..................... H03H 3/02 |
| 2018/0041193 A1 * | 2/2018 | Chen ...................... H03H 3/08 |

OTHER PUBLICATIONS

Komatsu et al., "Tunable Radio-Frequency Filters Using Acoustic Wave Resonators and Variable Capacitors", Japanese Journal of Applied Physics, 2010 vol. 49, 07HD24 pp. 1-4. (Year: 2010).*

(Continued)

*Primary Examiner* — Benny T Lee
*Assistant Examiner* — Hafizur Rahman
(74) *Attorney, Agent, or Firm* — Withrow & Terranova, P.L.L.C.

(57) ABSTRACT

Reduced-size guided-surface acoustic wave (SAW) resonators are disclosed. Guided-SAW resonators can achieve high acoustic coupling and acoustic quality Q, but may have a larger surface area compared with a traditional temperature compensated (TC)-SAW resonator. In an exemplary aspect, a guided-SAW device is fabricated with a metal-insulator-metal (MIM) capacitor to produce a guided-SAW which has the same high Q with a surface area which is the same or less than traditional TC-SAW resonators.

21 Claims, 9 Drawing Sheets

(56) References Cited

OTHER PUBLICATIONS

Omori et al., "Suppression of Transverse Mode Responses in Ultra-Wideband SAW Resonators Fabricated on a Cu-Grating/15° YX-LiNbO3 Structure", IEEE Transactions on Ultrasonics, Ferroelectrics, and Frequency Control, vol. 54, No. 10, Oct. 2007, p. 2. (Year: 2007).*

Plessky, V.P., et al., "Reduced Passband Ladder Type Saw Impedence Element Filters on Strong Piezoelectric Substrates," IEEE Ultrasonics Symposium, 1996, 5 pages.

* cited by examiner

REDUCED-SIZE GUIDED-SURFACE ACOUSTIC WAVE (SAW) DEVICES

FIELD OF THE DISCLOSURE

The present disclosure relates to acoustic wave devices, and particularly to guided-surface acoustic wave (SAW) devices.

BACKGROUND

Acoustic wave devices are widely used in modern electronics. At a high level, acoustic wave devices include a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions.

Surface acoustic wave (SAW) devices, such as SAW resonators and SAW filters, are used in many applications such as radio frequency (RF) filters. For example, SAW filters are commonly used in second generation (2G), third generation (3G), fourth generation (4G), and fifth generation (5G) wireless receiver front ends, duplexers, and receive filters. The widespread use of SAW filters is due to, at least in part, the fact that SAW filters exhibit low insertion loss with good rejection, can achieve broad bandwidths, and are a small fraction of the size of traditional cavity and ceramic filters. As the use of SAW filters in modern RF communication systems increase, there is a need for SAW filters with improved quality factor Q and reduced energy leakage.

SUMMARY

The present disclosure relates to acoustic wave devices, and particularly to reduced-size guided-surface acoustic wave (SAW) resonators. Guided-SAW resonators can achieve high acoustic coupling and acoustic quality Q, but may have a larger surface area compared with a traditional temperature compensated (TC)-SAW resonator. In an exemplary aspect, a guided-SAW device is fabricated with a metal-insulator-metal (MIM) capacitor to produce a guided-SAW which has the same high Q with a surface area which is the same or less than traditional TC-SAW resonators.

An exemplary embodiment relates to a SAW device. The SAW device includes a guided piezoelectric substrate and a transducer disposed over the piezoelectric substrate. The transducer includes a first set of electrode fingers and a second set of electrode fingers interleaved with the first set of electrode fingers. The transducer also includes a first busbar coupled to the first set of electrode fingers and a second busbar coupled to the second set of electrode fingers. The transducer also includes a MIM capacitor comprising the first busbar.

Another exemplary embodiment relates to a radio frequency (RF) filter. The RF filter includes a plurality of SAW devices, each comprising a piezoelectric substrate. Each SAW device also includes a first busbar disposed over the piezoelectric substrate and a second busbar disposed over the piezoelectric substrate parallel to the first electrode. Each SAW device also includes interdigital electrode fingers coupled to the first busbar or the second busbar. Each SAW device also includes a first MIM capacitor comprising the first busbar and a second MIM capacitor comprising the second busbar.

Another exemplary embodiment relates to a method for forming a SAW device. The method includes depositing an interdigital transducer (IDT) comprising a first busbar and a second busbar over a guided piezoelectric substrate. The method also includes depositing a first dielectric layer over the first busbar and depositing a first top electrode over the first dielectric layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to acoustic wave devices, and particularly to reduced-size guided-surface acoustic wave (SAW) resonators. Guided-SAW resonators can achieve high acoustic coupling and acoustic quality Q, but may have a larger surface area compared with a traditional temperature compensated (TC)-SAW resonator. In an exemplary aspect, a guided-SAW device is fabricated with a metal-insulator-metal (MIM) capacitor to produce a guided-SAW which has the same high Q with a surface area which is the same or less than traditional TC-SAW resonators.

Figure 1A:
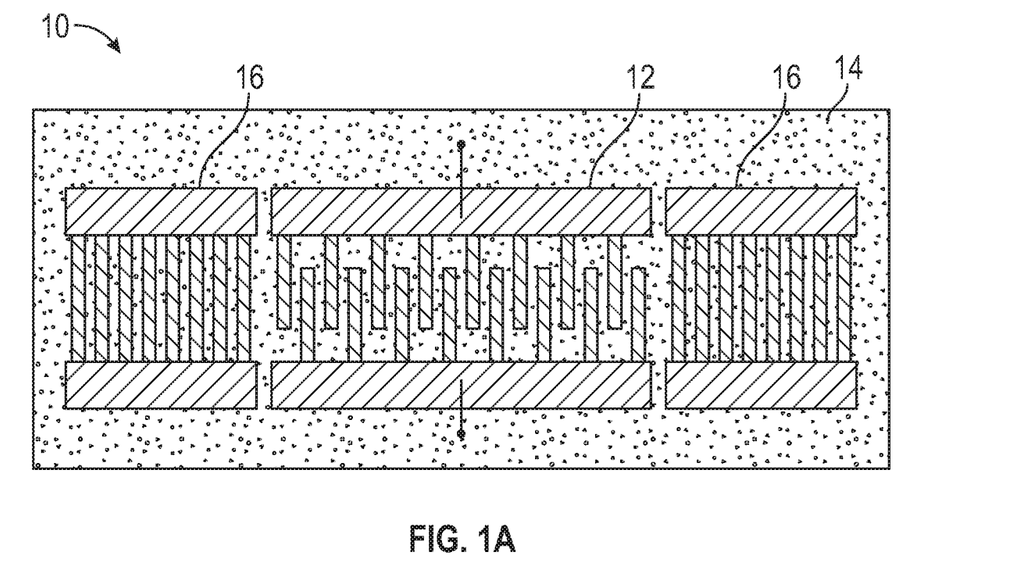
FIG. 1A is a schematic diagram of an exemplary surface acoustic wave (SAW) device, a SAW resonator.

FIG. 1A is a schematic diagram of an exemplary SAW device, a SAW resonator 10. The SAW resonator 10 includes a transducer 12 (which may be an interdigital transducer (IDT)) to convert an electric signal to an acoustic wave propagating on a surface of a piezoelectric substrate 14. The transducer 12 is positioned between two reflective gratings 16 to form the SAW resonator 10. The SAW resonator 10 can be incorporated into a device such as a filter or duplexer by interconnecting several SAW resonators 10 (and/or other resonators) electrically and/or acoustically.

Figure 1B:
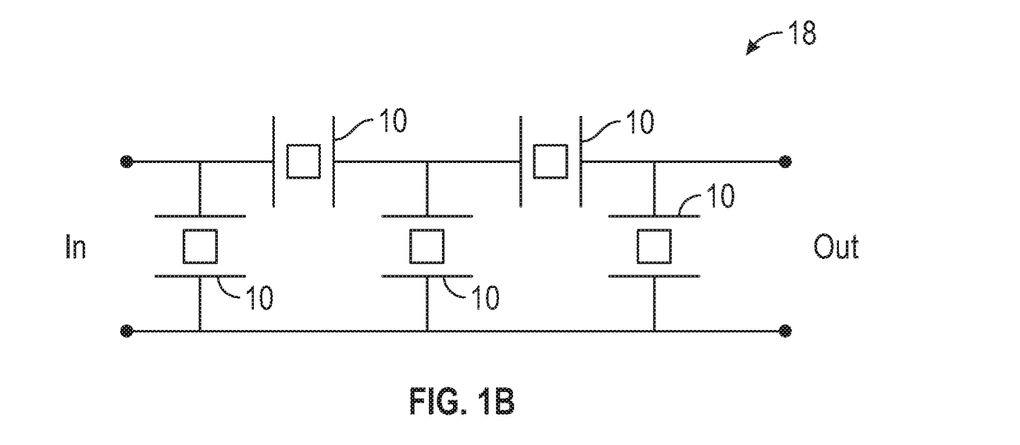
FIG. 1B is a schematic diagram of an exemplary ladder type filter including the SAW resonator of FIG. 1.

FIG. 1B is a schematic diagram of an exemplary ladder type filter 18 including the SAW resonator 10 of FIG. 1A. In this regard, several SAW resonators 10 are interconnected in an electrical network to form the exemplary ladder type filter 18. In other examples, the SAW resonators 10 can be arranged in other ways, such as a lattice configuration.

Figure 1C:
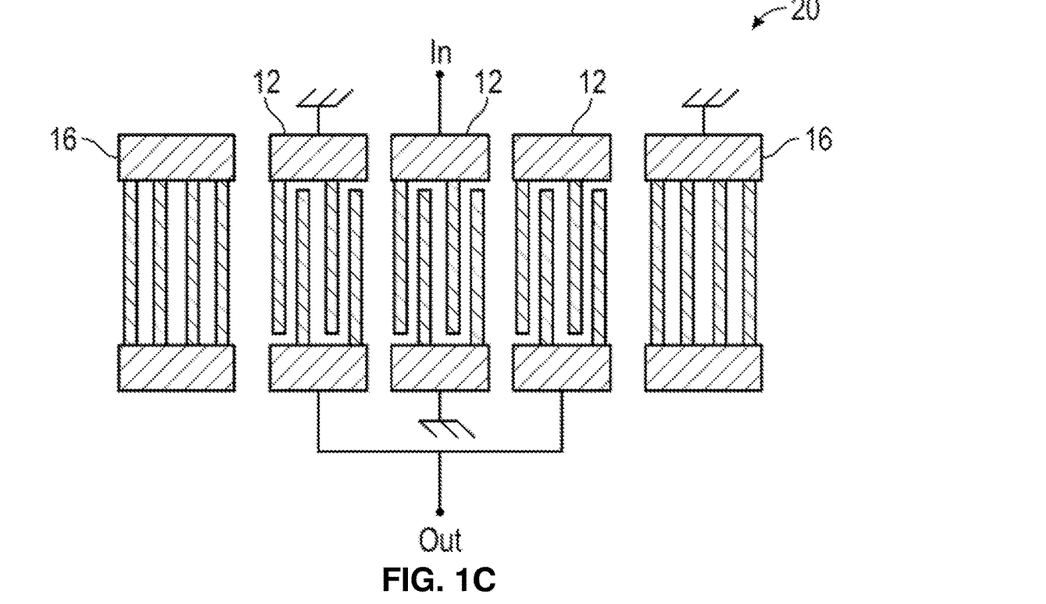
FIG. 1C is a schematic diagram of an exemplary coupled resonator filter (CRF) or double mode SAW (DMS) filter.

In still other examples, the SAW resonators 10 can be coupled acoustically, as depicted in FIG. 1C. FIG. 1C is a schematic diagram of an exemplary coupled resonator filter (CRF) 20 or double mode SAW (DMS) filter. In the CRF 20, several transducers 12 are positioned between the reflective gratings 16. One or several transducers 12 are connected in parallel between an input signal IN and a reference (e.g., ground), while another one or more transducers 12 are connected between the reference and an output signal OUT. The electrical signal at the input is transformed into an acoustical signal on the surface of the piezoelectric substrate 14. This acoustic wave propagates between input and output transducers 12 and is converted back into an electrical signal. Through selection of the number of transducers 12, their sizes, frequencies, apertures and other parameters, a band pass filter or other type of filter can be produced. In some examples, several CRF 20 stages are cascaded inside a filter to improve its performance. In some examples, some of the transducers 12 are not connected to a voltage and the reference voltage (ground) but are instead connected between two voltages which may be equal in amplitude and with 180 degrees phase difference (e.g., a differential or balanced drive). In some examples, the reflective gratings 16 may be absent or alternatively reflective gratings 16 may be inserted between the transducers 12.

Figure 2A:
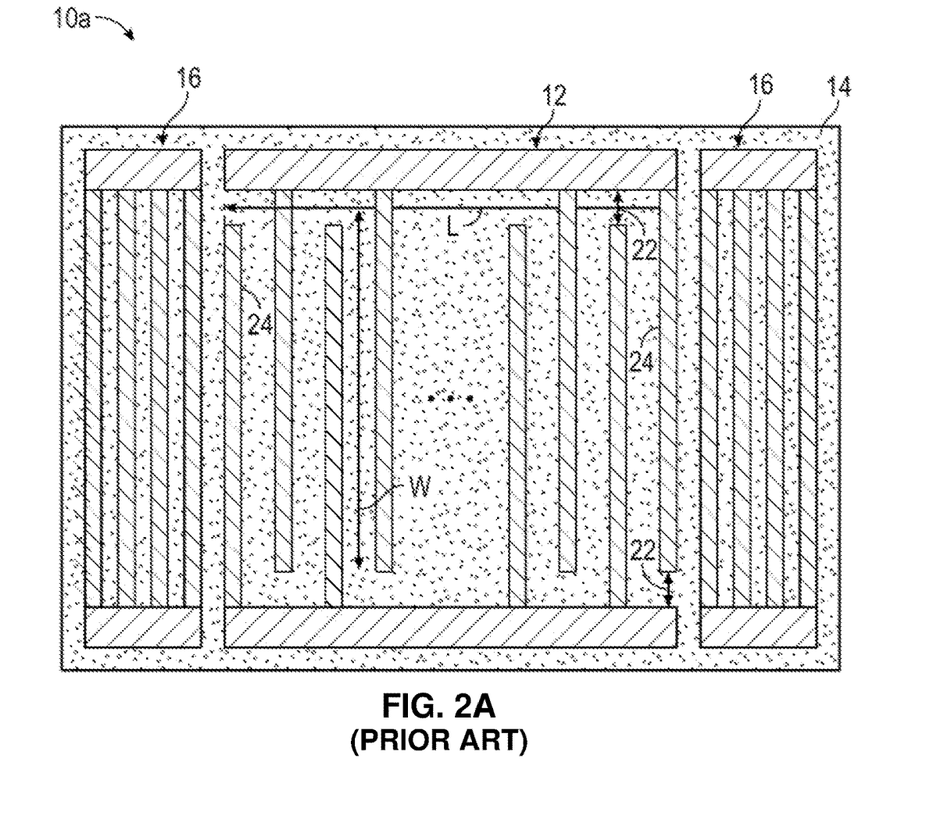
FIG. 2A is a schematic diagram of a traditional temperature compensated (TC)-SAW resonator.

FIG. 2A is a schematic diagram of a traditional TC-SAW resonator 10a. The traditional TC-SAW resonator 10a includes the transducer 12 (e.g., IDT) and reflective gratings 16 as described above with respect to FIGS. 1A-1C, disposed over a piezoelectric substrate 14. To confine acoustic energy within an aperture (e.g., active region), the transducer 12 includes a fast region 22 defined by a gap at ends of electrode fingers 24.

The traditional TC-SAW resonator 10a can be designed to operate with a desired resonant frequency based on a distance (e.g., pitch) between two consecutive electrode fingers 24. That is, a wavelength λ of a SAW resonator 10, 10a is defined herein as twice the pitch between consecutive electrode fingers 24 and corresponds to a wavelength of the resonant frequency. Other performance parameters of the traditional TC-SAW resonator 10a can be modified by adjusting, among other things, a number of electrode fingers 24 in the transducer 12 and a width W of the aperture of the transducer 12.

As an example, the traditional TC-SAW resonator 10a may be designed with a resonant frequency of 831.5 mega- Hertz (MHz) on a 128° YX lithium niobate (LiNbO$_3$) piezoelectric substrate 14. In this example, the traditional TC-SAW resonator 10a has a duty factor (DF) of 0.40, an acoustic coupling k2e of 8.53%, a capacitance per mm of aperture per number of finger pairs of 0.238 pF/W$_{mm}$/overlap (corresponding to DF=0.40), a series resonance quality factor Q$_s$ of 1300 and a parallel resonance quality factor Q$_p$ of 1700.

In this example, the transducer 12 of the traditional TC-SAW resonator 10a has a pitch of 0.002184 millimeters (mm), 191 electrode fingers 24, and an aperture width W of 0.1122 mm. The total resonator capacitance is 5.1 pF. The active area of the transducer 12 can be calculated as the width W of the aperture multiplied by an aperture length L (e.g., the number of electrode fingers 24 multiplied by the pitch of the electrode fingers 24). In this example, the active area of the transducer 12 is 0.468 mm$^2$, which is the area of the traditional TC-SAW resonator 10a which contributes to the acoustic response and static capacitance. In addition, each fast region 22 of the transducer 12 has a width of 1.5λ=0.006553 mm. Thus, the remaining region of the transducer 12 can be calculated as 2*(191*0.002184 mm)*0.006553 mm=0.00547 mm$^2$.

Figure 2B:
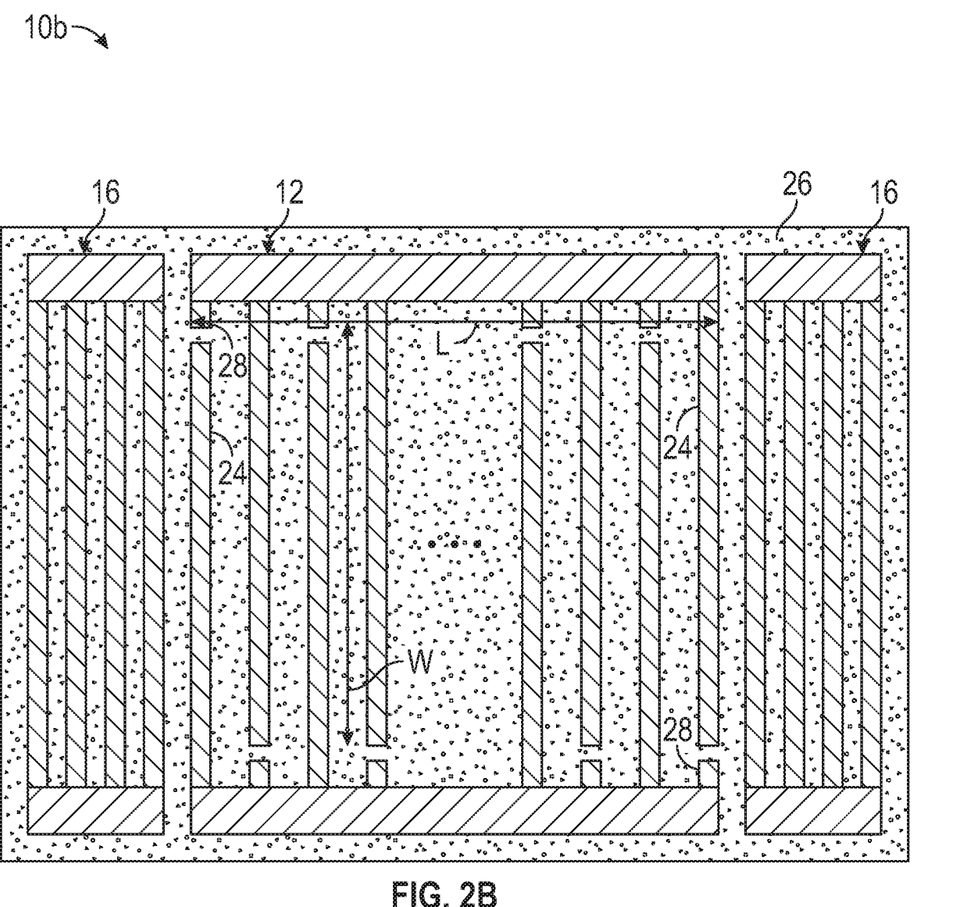
FIG. 2B is a schematic diagram of a guided-SAW resonator.

FIG. 2B is a schematic diagram of a guided-SAW resonator 10b. The guided-SAW resonator 10b includes the transducer 12 (e.g., IDT) and reflective gratings 16 as described above with respect to FIGS. 1A-1C, disposed over a guided piezoelectric substrate 26. The guided-SAW resonator 10b (e.g., SAW device having a guided SAW structure) has a layered substrate (e.g., the guided piezoelectric substrate 26) where a layer of piezoelectric material is bonded or deposited on (e.g., directly on) the surface of a support or carrier substrate. As compared to the traditional TC-SAW resonator 10a, the guided-SAW resonator 10b has an improved quality factor Q, an improved acoustic coupling k2e, and an improved thermal coefficient of frequency (TCF).

However, the area of the guided-SAW resonator 10b may be larger than a traditional TC-SAW resonator 10a with a similar resonant frequency, static capacitance, and number of electrode fingers 24. For example, the guided-SAW resonator 10b has approximately the same resonant frequency (831.5 MHz), static capacitance (C$_{stat}$~5.1 pF), and number of electrode fingers 24 (191) as the traditional TC-SAW resonator 10a of FIG. 2A. The guided-SAW resonator 10b has much higher acoustic coupling and a quality factor Q which exceeds 3500, but the area of the resonator IDT increases by ~36%. This 36% increase uses the assumption that the top guiding piezoelectric layer is a rotated y-cut of lithium tantalate with a DF in the range of 0.60.

The increase in area of the guided-SAW resonator 10b is primarily due to two factors. First, the pitch of the electrode fingers 24 increases by 10% (e.g., 0.002402 mm). The guided piezoelectric substrate 26 causes the acoustic velocity to be approximately 10% higher than the traditional piezoelectric substrate 14. Therefore, the pitch of the electrode fingers 24 is increased by approximately 10% to maintain the same resonant frequency. Second, for the same number of electrode fingers 24, the acoustic aperture increases by a factor of 1/0.808. This is a consequence of the fact that the guided-SAW resonator 10b capacitance per finger pair per mm of aperture decreases by about 19.2% (e.g., DF=0.60 on lithium tantalate) relative to the traditional TC-SAW resonator 10a.

It should be noted that in some examples, as depicted in FIG. 2B, the guided-SAW resonator 10b includes dummy fingers 28 to guide surface waves in place of the fast region 22 of the traditional TC-SAW resonator 10a. The area of the dummy fingers 28 (e.g., a width of the dummy fingers 28 is 1.5λ=0.007 mm) may be comparable to the area of the fast region 22 of FIG. 2A, and thus the active area of the guided-SAW resonator 10b is compared to the active area of the traditional TC-SAW resonator 10a.

Figure 3:
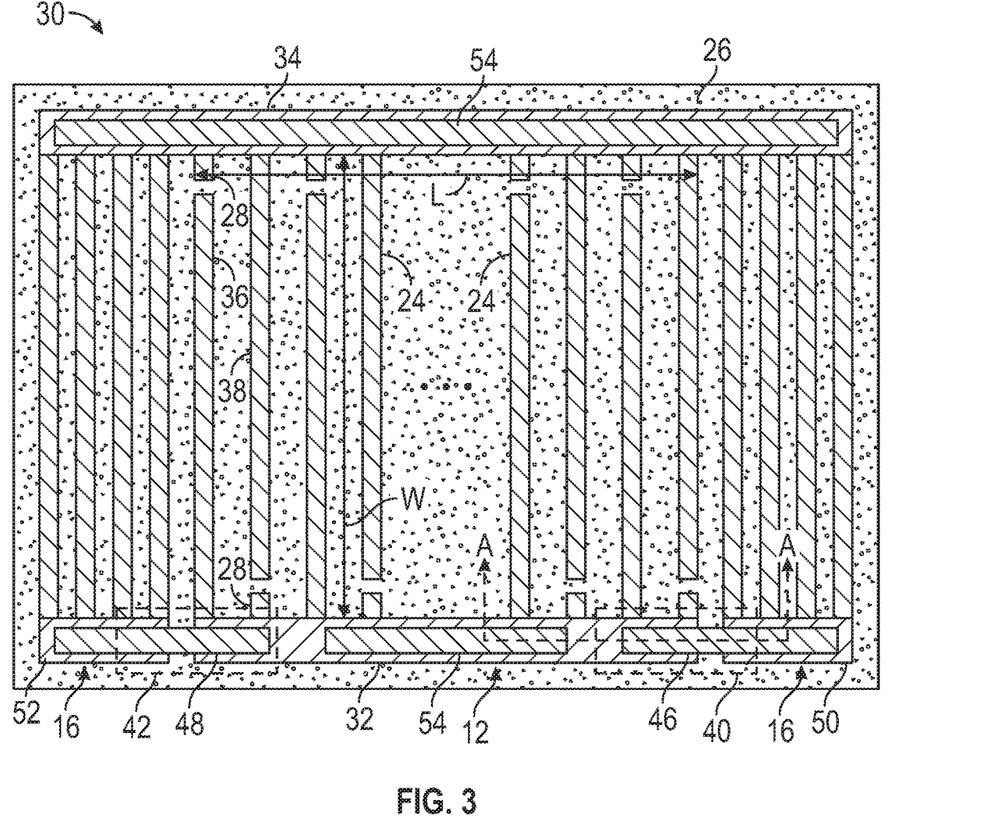
FIG. 3 is a schematic diagram of an exemplary reduced-size guided-SAW device.

FIG. 3 is a schematic diagram of an exemplary reduced-size guided-SAW device 30. The guided-SAW device 30 of FIG. 3 may be a guided-SAW resonator (similar to the guided-SAW resonator 10b of FIG. 2B). The guided-SAW device 30 includes a guided piezoelectric substrate 26, and a transducer 12 between reflective gratings 16 disposed over the guided piezoelectric substrate 26. The transducer 12 is an IDT which includes electrode fingers 24 coupled to a first busbar 32 (e.g., an output busbar) and a second busbar 34 (e.g., an input busbar). There may be a first set of electrode fingers 36 and a second set of electrode fingers 38 interleaved with the first set of electrode fingers 36, with the first busbar 32 coupled to the first set of electrode fingers 36 and the second busbar 34 coupled to the second set of electrode fingers 38. Dummy fingers 28 may extend from the first busbar 32 into a gap with the second set of electrode fingers 38, and from the second busbar 34 into another gap with the first set of electrode fingers 36.

The guided-SAW device 30 further includes one or more MIM capacitors 40, 42 disposed over the transducer 12. Using the MIM capacitors 40, 42, the additional acoustic coupling k2e facilitated through the guided piezoelectric substrate 26 is traded off for a reduced transducer 12 area (aperture width W×aperture length L). For example, if the MIM capacitors 40, 42 have a capacitance density that is much larger than that of the transducer 12, placing the MIM capacitors 40, 42 in parallel with the transducer 12 has the effect of reducing the overall acoustic coupling k2e to a value close to that of the traditional TC-SAW resonator 10a while maintaining the same static capacitance and simultaneously reducing the size of the guided-SAW device 30. The MIM capacitors 40, 42 may be disposed only over one or both busbars 32, 34.

Figure 4:
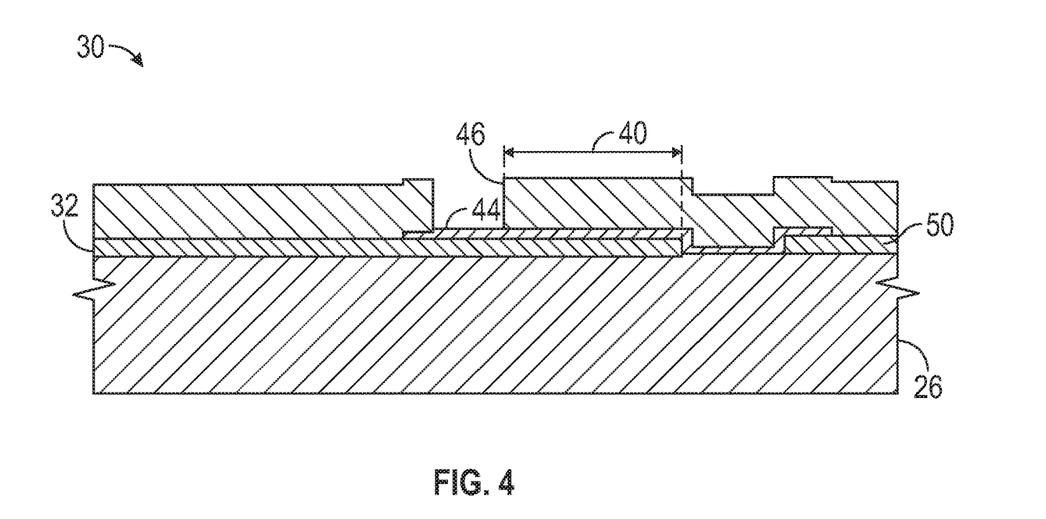
FIG. 4 is a cross-sectional view of the exemplary reduced-size guided-SAW device of FIG. 3, taken along line A-A.

FIG. 4 is a cross-sectional view of the exemplary reduced-size guided-SAW device 30 of FIG. 3, taken along line A-A. With reference to FIGS. 3 and 4, the guided-SAW device 30 includes a first MIM capacitor 40 which includes the first busbar 32. That is, the first MIM capacitor 40 includes the first busbar 32, a first dielectric layer 44 (which may include one or a series of dielectric layers) disposed over the first busbar 32 and a first top electrode 46 disposed over the first dielectric layer 44 to form the first MIM capacitor 40. Similarly, a second MIM capacitor 42 includes the first busbar 32, a second dielectric layer (not shown, which may similarly include one or a series of dielectric layers), and a second top electrode 48 disposed over the second dielectric layer.

FIGS. 3 and 4 illustrate the first MIM capacitor 40 at a first end of the first busbar 32 adjacent a first grating busbar 50 (forming part of a reflective grating 16) and the second MIM capacitor 42 at a second end of the first busbar 32 adjacent a second grating busbar 52 (forming part of another reflective grating 16). Each of the first grating busbar 50 and the second grating busbar 52 is placed parallel with (e.g., having major lengths running along a same direction) and insulated from the first busbar 32. It should be understood that this is exemplary in nature and the number of MIM capacitors 40, 42, their placement, and size will vary in other embodiments.

In the example illustrated in FIGS. 3 and 4, the first MIM capacitor 40 and the second MIM capacitor 42 are formed with the first busbar 32, which is the output busbar of the guided-SAW device 30. The first top electrode 46 of the first MIM capacitor 40 is electrically coupled with the first grating busbar 50 (e.g., a portion of the first MIM capacitor 40 being directly deposited over the first grating busbar 50), and the second top electrode 48 of the second MIM capacitor 42 is electrically coupled with the second grating busbar 52 (e.g., a portion of the second MIM capacitor 42 being directly deposited over the second grating busbar 52). The second busbar 34 is the input busbar of the guided-SAW device 30, and extends across the transducer 12 and the reflective gratings 16. Thus, a signal from the second busbar 34 (e.g., the input busbar) routes to the MIM capacitors 40, 42 through the grating busbars 50, 52 and the reflective gratings 16.

By forming the MIM capacitors 40, 42 with and over the first busbar 32, the MIM capacitors 40, 42 can be formed simultaneously with fabrication and packaging processes for the guided-SAW device 30. For example, in some embodiments the first dielectric layer 44 of the first MIM capacitor 40 and the second dielectric layer of the second MIM capacitor 42 are formed with a single layer of dielectric material (e.g., silicon nitride (SiN)), which also serves as a passivation layer to seal the metal of the guided-SAW device 30 (e.g., the busbars 32, 34, 50, 52, electrode fingers 24, and/or reflective gratings 16). In other embodiments, they may be formed with a passivation layer (e.g., SiN) and a frequency trimming layer (e.g., silicon dioxide ($SiO_2$)) for trimming the frequency response of the guided-SAW device 30. In still other embodiments, the first dielectric layer 44 and/or the second dielectric layer may be formed with a series of dielectric layers, each comprising the same or different materials (e.g., SiN, $SiO_2$, $Si_xO_yN_z$, or another type of metallic oxide). In addition, the first top electrode 46 and the second top electrode 48 may be formed with a thick under bump metallization (UBM) layer, and additional portions of a UBM layer 54 can be formed over the first busbar 32 and/or the second busbar 34 (e.g., to form input and output connections).

In this regard, a process for forming the guided-SAW device 30 can include some or all of the following operations:

Guided Piezoelectric Substrate 26 Formation:

This may include bonding or depositing a piezoelectric material (e.g., lithium tantalate, lithium niobate, or another appropriate material) over a non-semiconductor support or carrier substrate. In some examples, a thickness of the piezoelectric layer, a SAW velocity of the piezoelectric layer, and an acoustic velocity of the non-semiconductor support substrate are such that a frequency of spurious modes above a resonant frequency of the guided-SAW device 30 is above a bulk wave cut-off frequency of the guided-SAW device 30. In some examples, the thickness of the piezoelectric layer is less than two times the wavelength λ.

Transducer 12 (e.g., IDT) Deposition:

This may include depositing metal or other conductive layer(s) over the guided piezoelectric substrate 26 to form the first busbar 32, the second busbar 34, the electrode fingers 24 (e.g., the first set of electrode fingers 36 and second set of electrode fingers 38), the reflective gratings 16, the first grating busbar 50, and the second grating busbar 52.

Passivation Deposition:

This may include a deposition of SiN (e.g., 850 angstroms (Å) of SiN), some combination of SiN and $SiO_2$ over the entire wafer (e.g., 300 Å SiN followed by 300 Å $SiO_2$), or an arbitrary combination of numerous dielectric layers (e.g., SiN, $SiO_2$, $Si_xO_yN_z$, or another type of metallic oxide).

MIM Capacitor Lithography:

This may include depositing a photoresist or similar layer and then opening all areas where passivation will be removed to allow direct contact of the UBM material with the base metal (e.g., areas of the first busbar 32, the second busbar 34, the first grating busbar 50, and the second grating busbar 52).

Passivation Etch:

This may include a dielectric plasma etch to remove passivation from areas where the UBM material will contact the base metal. This may also cause the first dielectric layer 44 of the first MIM capacitor 40 to be separated from the second dielectric layer of the second MIM capacitor 42.

Strip MIM Resist:

This may include removing the photoresist or similar MIM lithography layer through a chemical or other process.

UBM Lithography:

This may include depositing photoresist and then opening all areas where the UBM material is to contact base metal or cover the first dielectric layer 44 and/or second dielectric layer. This facilitates the UBM material forming the top electrode of the MIM capacitors 40, 42.

Descum/Etch:

This may include a short etch or descum to clean contact regions prior to UBM deposition.

Deposit UBM Material:

This may include a UBM evaporation process.

Strip UBM Resist:

This may include removing the photoresist or similar UBM lithography layer through a chemical or other process.

Through the process described above, a reduced-size guided-SAW device 30 is produced. The size of the MIM capacitors 40, 42 can be modified according to desired performance characteristics and size, as detailed with respect to FIGS. 5A and 5B.

It should be understood that the guided-SAW device 30 can be implemented as a SAW resonator 10 as described above with respect to FIGS. 1A-1C. For example, one or more of the guided-SAW device 30 of FIGS. 3 and 4 can be implemented in a radio frequency (RF) filter, such as the ladder type filter 18 of FIG. 1B. An RF filter may be configured as a passband or other filter to filter signals between 600 MHz and 1000 MHz. In some examples, an RF filter may be configured to filter signals between 600 MHz and 2700 MHz.

Figure 5A:
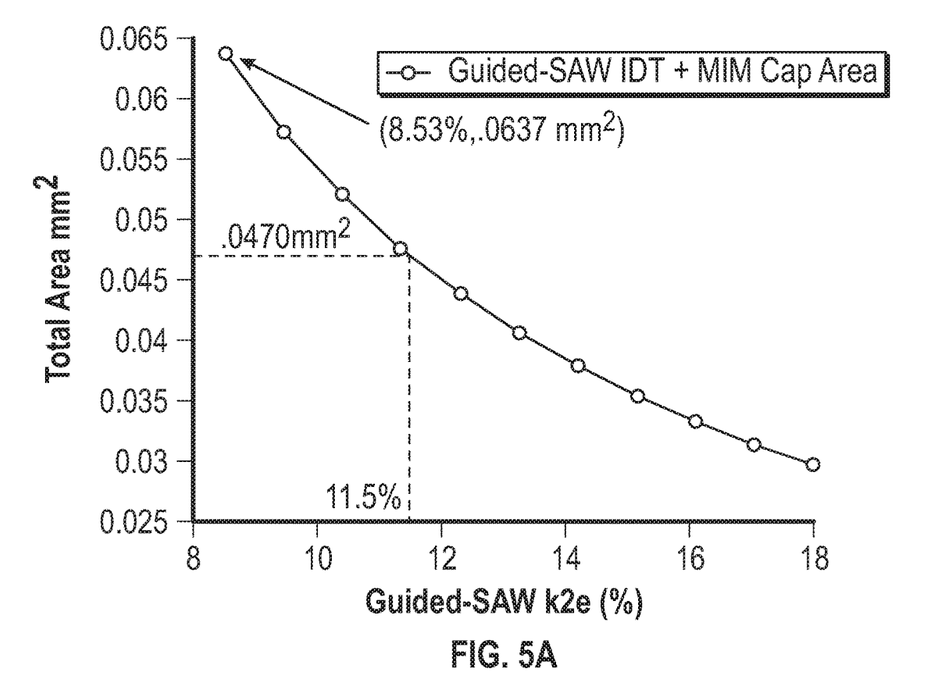
FIG. 5A illustrates an approximate relationship between acoustic coupling and metal-insulator-metal (MIM) capacitor area of the exemplary guided-SAW device of FIG. 3 necessary to achieve a baseline acoustic coupling and capacitance.

FIG. 5A illustrates an approximate relationship between acoustic coupling k2e and MIM capacitor area of the exemplary guided-SAW device 30 of FIG. 3 necessary to achieve a baseline acoustic coupling k2e and capacitance. FIG. 5A illustrates the resonator size vs. guided-SAW coupling tradeoffs that can be performed assuming that the resulting guided-SAW device 30 which includes one or more MIM capacitors 40, 42 exhibits a desired acoustic coupling k2e and static capacitance $C_{stat}$. For example, with reference to the traditional TC-SAW resonator 10a of FIG. 2A as a baseline, FIG. 5A is illustrated with respect to a final acoustic coupling k2e of 8.53% and a final static capacitance $C_{stat}$ of 5.1 pF.

Figure 5B:
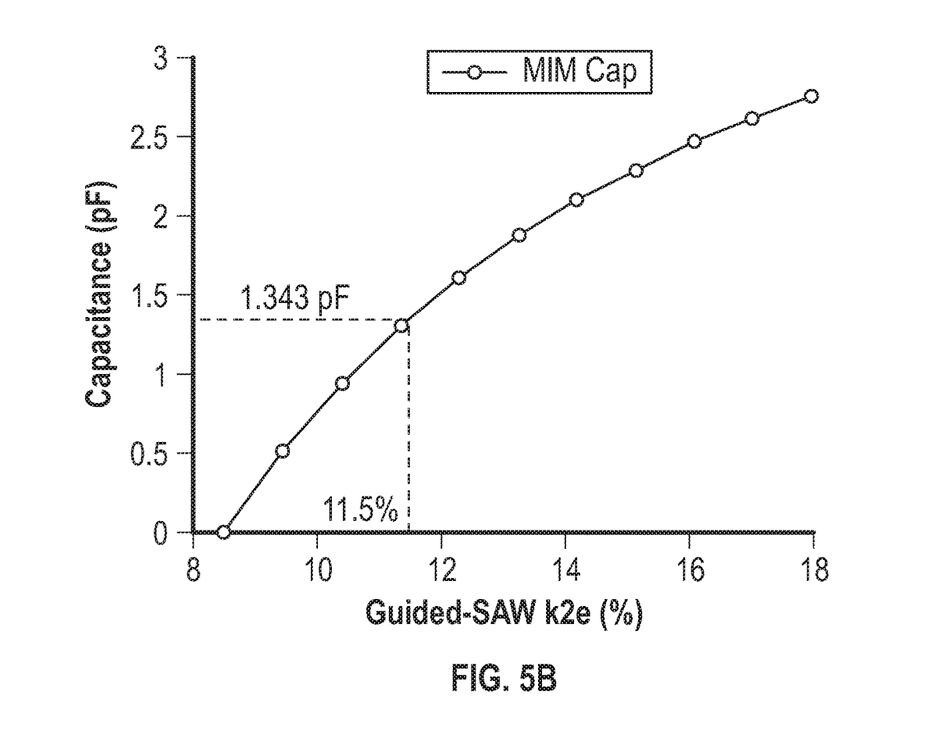
FIG. 5B illustrates capacitance values of the exemplary guided-SAW device of FIGS. 3 and 5A as a function of acoustic coupling.

FIG. 5B illustrates capacitance values of the exemplary guided-SAW device 30 of FIGS. 3 and 5A as a function of acoustic coupling k2e. FIG. 5B illustrates the total capacitance of the MIM capacitors 40, 42 that are placed in parallel with the transducer 12 in FIG. 3 to achieve the total area indicated in FIG. 5A.

FIGS. 5A and 5B indicate that at an approximate guided-SAW acoustic coupling k2e of 11.5%, the guided-SAW device 30 with a 1.343 pF parallel MIM capacitor 40, 42 achieves the baseline traditional TC-SAW acoustic coupling k2e (8.53%) and static capacitance $C_{stat}$ (5.1 pF) in a 0.0470 mm² area. This is essentially equal to the area occupied by the baseline traditional TC-SAW resonator 10a (0.0468 mm²). In an exemplary aspect, level of acoustic coupling k2e is achieved using 28Y lithium tantalate. Accordingly, the guided-SAW device 30 can directly replace the traditional TC-SAW resonator 10a size-wise with the advantage of the superior quality factor Q provided by the guided piezoelectric substrate 26.

The MIM capacitors 40, 42 of the guided-SAW device 30 can be implemented in parallel with the first busbar 32 as described above with respect to FIGS. 3 and 4, with the area of the MIM capacitors 40, 42 determined by the calculated capacitance needed. With respect to the exemplary 1.343 pF of capacitance from FIGS. 5A and 5B, the implementation of the MIM capacitors 40, 42 is described with respect to a single thick passivation layer and thinner passivation and trimming layers.

First, with respect to the single thick passivation layer, the first dielectric layer 44 and the second dielectric layer are comprised of an 850 Å layer of SiN ($\varepsilon_r \sim 7.5$) over which the first top electrode 46 and the second top electrode 48 will be deposited. Therefore, the capacitance density of these parallel plate MIM capacitors 40, 42 will be:

$$C_{density} = \frac{7.5 \cdot 8.854 \cdot 10^{-12}\, \text{F/m}}{850 \cdot 10^{-10}\, \text{m}} \cdot \left(\frac{1 \cdot 10^{-6}\, \text{m}}{1\, \text{um}}\right)^2 = 7.812 \cdot 10^{-4}\, \text{pF}/\mu\text{m}^2.$$

Given this capacitance density, the size of the 1.343 pF of the MIM capacitors 40, 42 required to achieve the desired area is:

$$\frac{1.343\, \text{pF}}{7.812 \cdot 10^{-4}\, \text{pF}/\mu\text{m}^2} \sim 1720\, \mu\text{m}^2.$$

As depicted in FIGS. 3 and 4, the area of each of the first MIM capacitor 40 and the second MIM capacitor 42 is 860 µm². The first busbar 32 width is 20 µm, and each MIM capacitor 40, 42 is therefore 43 µm×20 µm.

Second, with respect to the thinner passivation and trimming layers, the first dielectric layer 44 and the second dielectric layer include a 300 Å SiN passivation layer and a 300 Å SiO₂ trimming layer. The capacitance density of this capacitor can be expressed as:

$$C_{density} = \varepsilon_0 \cdot \frac{1}{\frac{h_{SiN}}{7.5} + \frac{h_{SiO2}}{4.0}}.$$

Given the nominal layer thicknesses specified above (300 Å each), the nominal capacitance density for the MIM capacitors 40, 42 will be $$C_{density}^{(nominal)} =$$

$$8.854 \cdot 10^{-12}\, \text{F/m} \cdot \frac{2.61}{300 \cdot 10^{-10}\, \text{m}} \cdot \left(\frac{1 \cdot 10^{-6}\, \text{m}}{1\, \text{um}}\right) = 7.703 \cdot 10^{-4}\, \text{pF}/\mu\text{m}^2.$$

In some examples, the deposition thickness of the SiN passivation layer can vary by ~10 Å (corresponding to σ~1.6 Å) and the SiO₂ trim layer can vary by ~15 Å (corresponding to σ~2.5 Å). Using these numbers, a window for the worst-case capacitance density can be calculated:

$$\varepsilon_0 \cdot \frac{1}{\frac{305 \cdot 10^{-10}\, \text{m}}{7.5} + \frac{307.5 \cdot 10^{-10}\, \text{m}}{4.0}} \leq$$

$$C_{density} \leq \varepsilon_0 \cdot \frac{1}{\frac{295 \cdot 10^{-10}\, \text{m}}{7.5} + \frac{292.5 \cdot 10^{-10}\, \text{m}}{4.0}}$$

$$\Downarrow$$

$$7.533 \cdot 10^{-4}\, \text{pF}/\mu\text{m}^2 \leq C_{density} \leq 7.873 \cdot 10^{-4}\, \text{pF}/\mu\text{m}^2.$$

The above variation represents an approximate +/−2.25% variation from the nominal value of $7.703 \cdot 10^{-4}\, \text{pF}/\mu\text{m}^2$. The impact of a +/−5% variation is illustrated with respect to FIGS. 7A-7C.

Figure 6A:
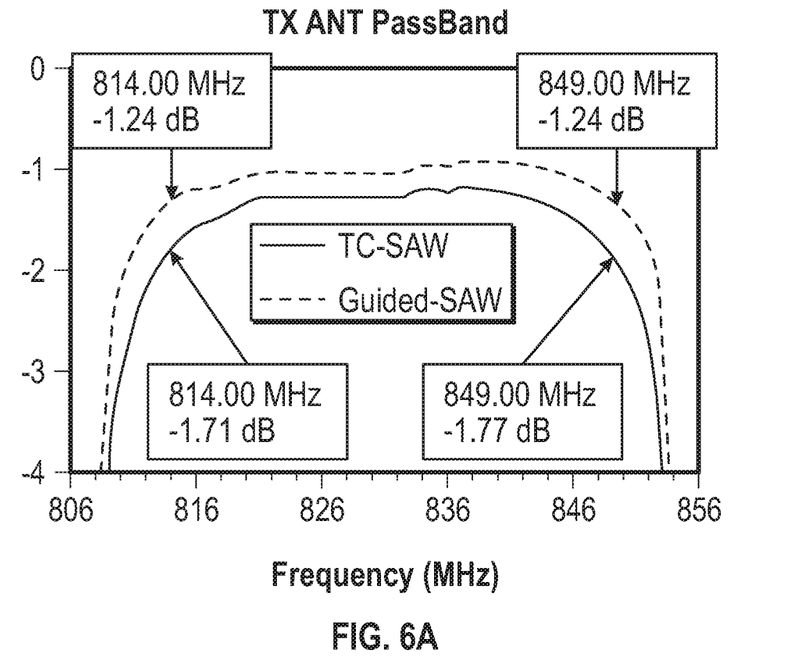
FIGS. 6A-6C are graphical representations comparing performance of the traditional TC-SAW resonator of FIG. 2A with the reduced-size guided-SAW resonator of FIG. 4.
Figure 6B:
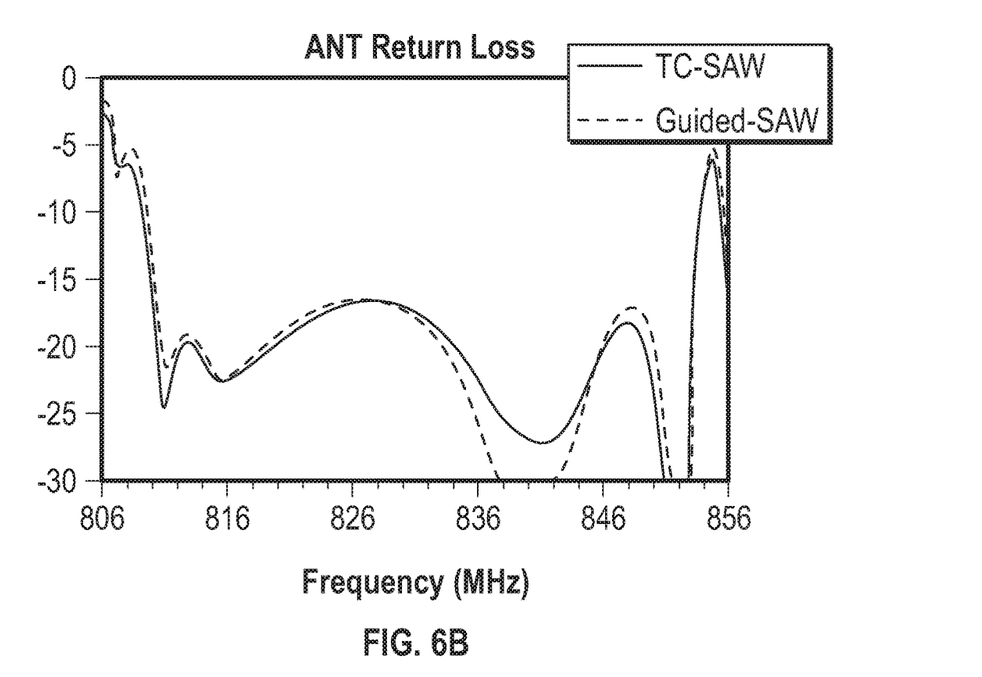
Figure 6C:
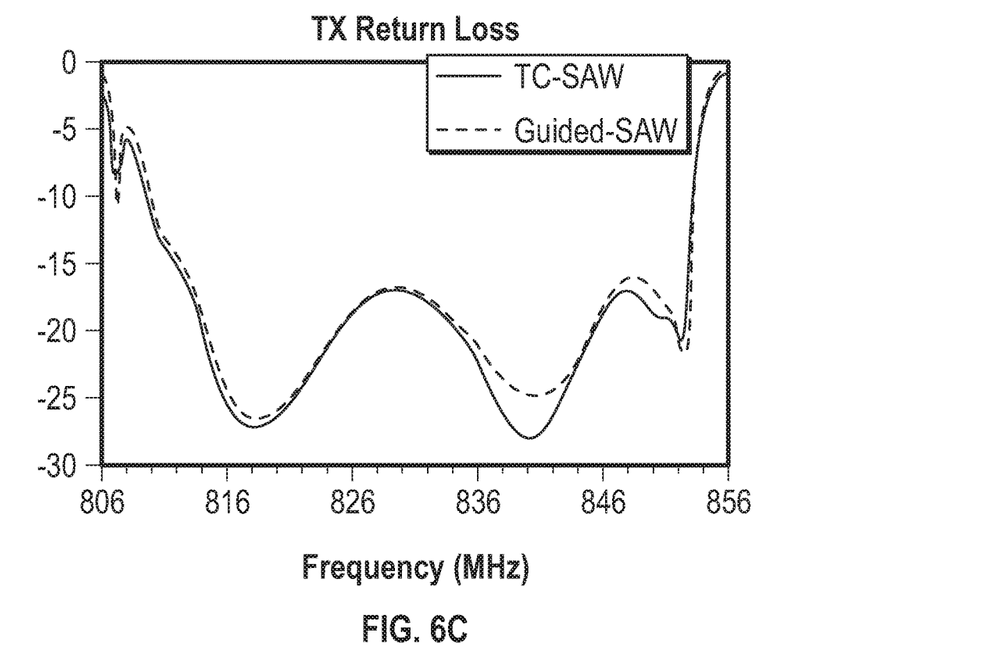

FIGS. 6A-6C are graphical representations comparing performance of a ladder filter comprised of traditional TC-SAW resonators 10a of FIG. 2A with one comprised of the reduced-size guided-SAW resonator 30 of FIG. 3. As illustrated in FIGS. 3A-3C, for near-identical return loss in the transmit (TX) band, a filter constructed from the guided-SAW device 30 with Q=250 MIM capacitors 40, 42 provides superior passband performance, reducing loss by ~0.5 decibels (dB) at the band edges as compared with the traditional TC-SAW resonator 10a. This represents a significant improvement in performance with no meaningful increase in resonator size.

Figure 7A:
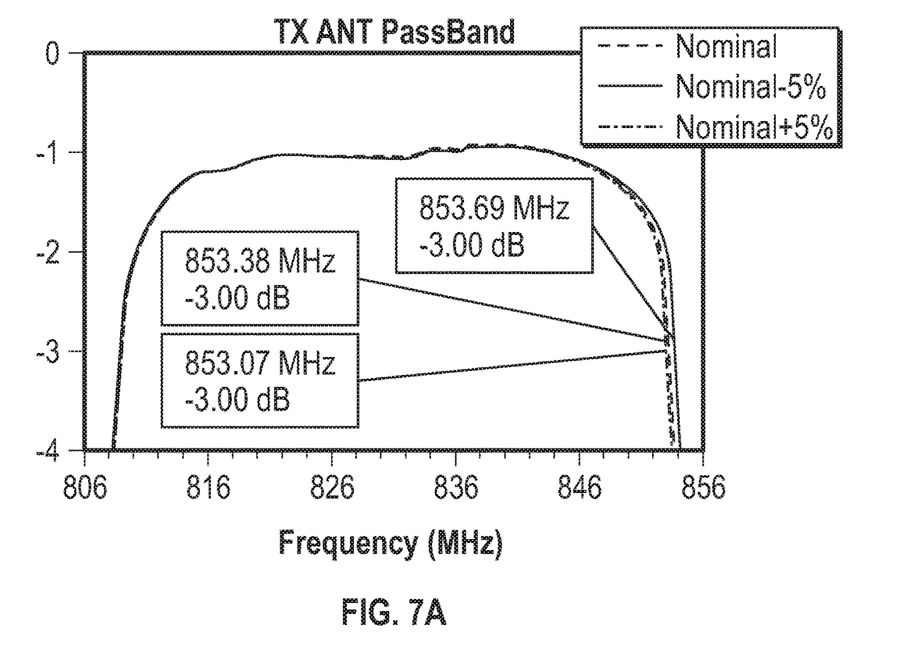
FIGS. 7A-7C are graphical representations comparing performance of the reduced-size guided-SAW device of FIG. 4 under variations of the MIM capacitors.
Figure 7B:
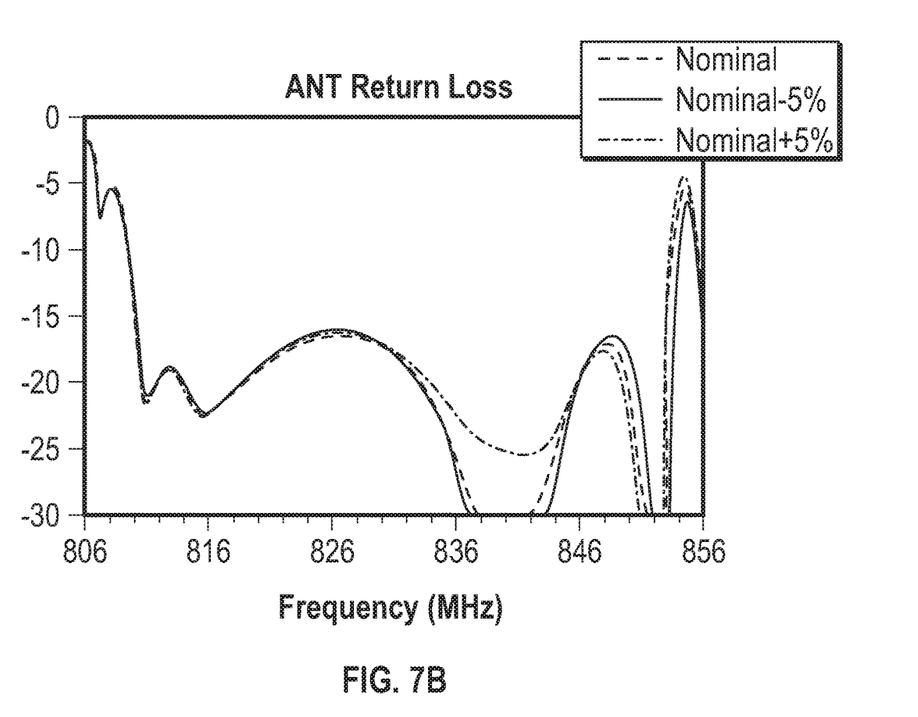
Figure 7C:
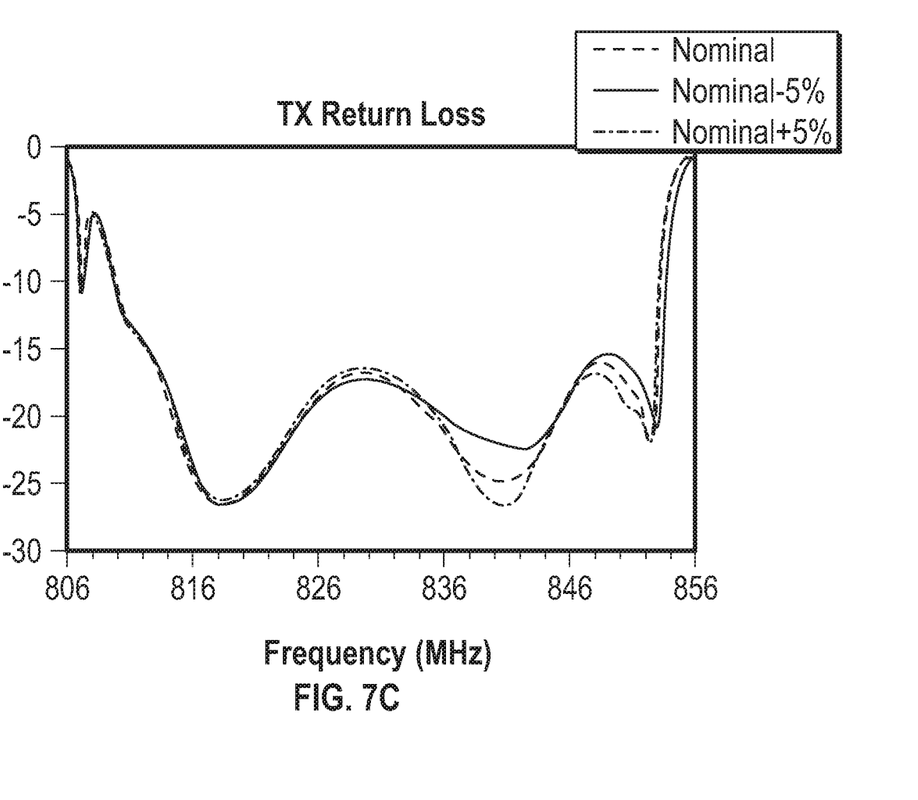

FIGS. 7A-7C are graphical representations comparing performance of the reduced-size guided-SAW device 30 of FIG. 3 under variations of the MIM capacitors 40, 42. FIGS. 7A-7C compare the passband and return loss for a nominal case and +/−5% in capacitance density where the first dielectric layer 44 and the second dielectric layer include a 300 Å SiN passivation layer and a 300 Å SiO₂ trimming layer, to be more conservative than the calculated +/−2.25% from above.

The results in FIGS. 7A-7C indicate that the TX response is fairly stable against +/−5% variations in capacitance of the MIM capacitors 40, 42. The passband itself [814 MHz, 849 MHz] changes very little. The main impact is a ~+/~300 kiloHertz (kHz) change in bandwidth manifesting on the upper filter skirt. Assuming that this variation is slow across the wafer of the guided-SAW device 30, the trim process should align the skirts at the upper band edge and transfer the bandwidth delta to the lower skirt.

Those skilled in the art will recognize improvements and modifications to the preferred embodiments of the present disclosure. All such improvements and modifications are considered within the scope of the concepts disclosed herein and the claims that follow.

What is claimed is:

1. A surface acoustic wave (SAW) device, comprising:
a guided piezoelectric substrate; and
a transducer disposed over the piezoelectric substrate, comprising:
   a first set of electrode fingers;
   a second set of electrode fingers interleaved with the first set of electrode fingers;
   a first busbar coupled to the first set of electrode fingers;
   a second busbar coupled to the second set of electrode fingers; and
   a first metal-insulator-metal (MIM) capacitor comprising:
      the first busbar;
      a first dielectric layer disposed over the first busbar; and
      a first under bump metallization (UBM) layer disposed over the first dielectric layer.

2. The SAW device of claim 1, further comprising a second MIM capacitor comprising in part the first busbar.

3. The SAW device of claim 1, wherein the first dielectric layer comprises a trimming layer configured to trim a frequency response of the SAW device.

4. The SAW device of claim 1, wherein the SAW device comprises a SAW resonator formed with a reflective grating adjacent the transducer.

5. The SAW device of claim 4, wherein the reflective grating comprises a first grating busbar parallel with and insulated from the first busbar.

6. The SAW device of claim 5, wherein the first MIM capacitor comprises a first top electrode comprising the first UBM layer and coupled to the first grating busbar.

7. The SAW device of claim 6, wherein the first dielectric layer comprises a first series of dielectric layers.

8. The SAW device of claim 1, wherein the guided piezoelectric substrate comprises:
a non-semiconductor support substrate; and
a piezoelectric layer on a surface of the non-semiconductor support substrate.

9. The SAW device of claim 8, wherein a thickness of the piezoelectric layer is less than two times $\lambda$, where $\lambda$ is a wavelength of a resonant frequency of the SAW device.

10. The SAW device of claim 8, wherein a thickness of the piezoelectric layer, a SAW velocity of the piezoelectric layer, and an acoustic velocity of the non-semiconductor support substrate are such that a frequency of spurious modes above a resonant frequency of the SAW device is above a bulk wave cut-off frequency of the SAW device.

11. A radio frequency (RF) filter, comprising:
a plurality of surface acoustic wave (SAW) devices, each comprising: a piezoelectric substrate;
a first busbar disposed over the piezoelectric substrate;
a second busbar disposed over the piezoelectric substrate parallel to the first busbar;
interdigital electrode fingers coupled to the first busbar or the second busbar;
a first metal-insulator-metal (MIM) capacitor comprising in part the first busbar; and
a second MIM capacitor comprising in part the first busbar.

12. The RF filter of claim 11, wherein:
each of the plurality of SAW devices comprises a SAW resonator formed with a reflective grating comprising a first grating busbar; and
the first MIM capacitor comprises:
   a first dielectric layer disposed over the first busbar; and
   a first top electrode disposed over the first dielectric layer and coupled to the first grating busbar.

13. The RF filter of claim 11, wherein the RF filter is configured to filter signals between 600 megahertz (MHz) and 2700 MHz.

14. The RF filter of claim 11 wherein each of the plurality of SAW devices is a guided-SAW resonator.

15. The RF filter of claim 14, wherein the plurality of guided SAW devices are disposed in a ladder filter configuration.

16. The RF filter of claim 11, wherein a thickness of the piezoelectric substrate and a SAW velocity of the piezoelectric substrate are such that a frequency of spurious modes above a resonant frequency of at least one of the plurality of SAW devices is above a bulk wave cut-off frequency.

17. A method for forming a surface acoustic wave (SAW) device, comprising:
depositing an interdigital transducer (IDT) comprising a first busbar and a second busbar over a guided piezoelectric substrate;
depositing a first series of dielectric layers directly over the first busbar; and
depositing a first top electrode directly over the first series of dielectric layers to form a first metal insulator-metal (MIM) capacitor.

18. The method of claim 17, further comprising:
depositing a second dielectric layer over the first busbar in a same process as the depositing of at least one of the first series of dielectric layers; and
depositing a second top electrode over the second dielectric layer;
wherein the first series of dielectric layers is separated from the second dielectric layer.

19. The method of claim 18, further comprising plasma etching a single dielectric layer to form the first dielectric layer and the second dielectric layer.

20. The method of claim 18, wherein each of the first top electrode and the second top electrode comprises an under bump metallization (UBM) layer.

21. The method of claim 20, further comprising:
etching a passivation layer over a first grating busbar and over a second grating busbar;
wherein:
   depositing the first top electrode comprises depositing a portion of the first top electrode directly over the first grating busbar; and
   depositing the second top electrode comprises depositing a portion of the second top electrode directly over the second grating busbar.

* * * * *